United States Patent [19]
Sugawara

[11] Patent Number: 5,936,888
[45] Date of Patent: Aug. 10, 1999

[54] SEMICONDUCTOR NON-VOLATILE MEMORY DEVICE HAVING FLOATING GATE TYPE REFERENCE CELL SHORT-CIRCUITED BETWEEN CONTROL GATE ELECTRODE AND FLOATING GATE ELECTRODE

[75] Inventor: Hiroshi Sugawara, Tokyo, Japan

[73] Assignee: NEC Corporation, Tokyo, Japan

[21] Appl. No.: 09/110,949

[22] Filed: Jul. 7, 1998

[30] Foreign Application Priority Data

Jul. 7, 1997 [JP] Japan ................................. 9-181235

[51] Int. Cl.$^6$ ................................................. G11C 16/06
[52] U.S. Cl. ................................. 365/185.2; 365/185.21
[58] Field of Search ........................... 365/185.2, 185.21, 365/185.1, 185.18, 210

[56] References Cited

U.S. PATENT DOCUMENTS

| | | | |
|---|---|---|---|
| 5,157,626 | 10/1992 | Watanabe | 365/185.2 |
| 5,253,201 | 10/1993 | Atsumi et al. | 365/185.2 |
| 5,381,374 | 1/1995 | Shiraishi et al. | 365/185.2 |
| 5,659,503 | 8/1997 | Sudo et al. | 365/185.2 |
| 5,757,697 | 5/1998 | Briner | 365/185.21 |
| 5,841,719 | 11/1998 | Hirata | 365/210 |
| 5,859,796 | 1/1999 | Cleveland | 365/185.2 |

Primary Examiner—Son Mai
Attorney, Agent, or Firm—McGinn & Gibb, P.C.

[57] ABSTRACT

An electrically erasable and programmable read only memory device supplies first current from a precharging circuit through a first input node of a sense amplifier to a selected bit line to see whether a selected floating gate type field effect transistor passes the first current or block the first current, and a reference voltage generator supplies reference voltage to a second input node of the sense amplifier so as to produce a potential difference between the first input node and the second input node; the reference voltage generator supplies second current from a dummy precharging circuit through the second input node and a reference floating gate type field effect transistor to a ground line so as to produce the reference voltage at the second input node; and the reference floating gate type field effect transistor has an interconnection between the floating gate electrode and the control gate electrode so as to prevent the floating gate electrode from accumulation of electron.

17 Claims, 10 Drawing Sheets

SEMICONDUCTOR NON-VOLATILE MEMORY DEVICE HAVING FLOATING GATE TYPE REFERENCE CELL SHORT-CIRCUITED BETWEEN CONTROL GATE ELECTRODE AND FLOATING GATE ELECTRODE

FIELD OF THE INVENTION

This invention relates to a semiconductor non-volatile memory device and, more particularly, to an electrically erasable and programmable read only memory device having a floating gate type reference voltage generator for generating a reference voltage.

DESCRIPTION OF THE RELATED ART

The electrically erasable and programmable read only memory device stores data bits in floating gate type field effect transistors. The floating gate type field effect transistor has a floating gate electrode, and electron is injected into and evacuated from the floating gate electrode. The electron is influential on the threshold of the field effect transistor. When the electron is injected into the floating gate, the injected electron raises the threshold of the floating gate type field effect transistor. The floating gate type field effect transistor recovers the threshold to the initial level after evacuation of the electron. The threshold is checked by applying a read potential between the high threshold and the low threshold to the control gate electrode usually overlapped with the floating gate electrode. If current flows through the channel, the floating gate type field effect transistor has the low threshold, and is referred to as "write-in state" or "on-state". On the other hand, if no current flows, the floating gate type field effect transistor has the high threshold, and is referred to as "erased state" or "off-state".

FIG. 1 illustrates a typical example of the electrically erasable and programmable read only memory device. The prior art electrically erasable and programmable read only memory device comprises memory cell arrays 1a/1b, and the floating gate type field effect transistors form the memory cell arrays 1a/1b. In other words, the floating gate type field effect transistor serves as a memory cell. Though not shown in FIG. 1, the control gate electrodes are selectively connected to word lines, and a source line is connected to the source nodes of the floating gate type field effect transistors. Bit lines BLA1 to BLAn and BLB1 to BLBn are selectively connected to the drain nodes of the floating gate type field effect transistors, and column addresses are respectively assigned to the bit lines BLA1 to BLAn and BLB1 to BLBn. Row addresses are respectively assigned to the word lines, and each floating gate type field effect transistor is accessible by specifying the row address and the column address.

FIG. 2 illustrates the structure of the memory cell MC. The source region SR and the drain region DR are formed in an active area defined by a field oxide layer FX selectively grown on a semiconductor substrate SB. The source region SR is connected to the source line, and the drain region DR is connected to one of the bit lines BLA1–BLAn/BLB1–BLBn. The semiconductor substrate SB and the field oxide layer FX are covered with an insulating structure IS, and a floating gate electrode FD is wrapped in the insulating structure IS. The insulating material under the floating gate electrode FD serves as a gate oxide layer GX, and the insulating material over the floating gate electrode FD forms an inter-level insulating layer IL. The word line WL extends on the inter-level insulating layer IL, and a part of the word line over the floating gate electrode FD serves as a control gate electrode CG. The coupling capacitance between the control gate electrode CG and the floating gate electrode FD is represented by CCF, and the coupling capacitance between the floating gate electrode FD and the substrate SB is represented by CALL. The ratio of the coupling capacitance CALL to the coupling capacitance CCF is regulated to 0.6. When the potential of 5 volts is applied to the control gate electrode CG, the floating gate FD is applied with 3.0 volts.

Turning back to FIG. 1, the prior art electrically erasable and programmable read only memory device further comprises an address buffer 2a connected to an address port 2b, and an address signal ADD1 is supplied to the address port 2b. Row address pre-decoders 3a/3b and a main row address decoder 4 are connected to the address buffers 2a/2b, and row address bits are supplied from the address buffer 2a to the row address pre-decoders 3a/3b and the main row address decoder 4. The word lines are selectively connected to word line drivers 5a/5b/5c, and the main row address decoder 4 and the row address pre-decoders 3a/3b cause the word line drivers 5a/5b/5c to energize the word lines specified by the row address bits. A voltage generator 6 selectively supplies a read voltage Vcg or a write-in voltage Vp to the main row address decoder 4 and the row address pre-decoders 3a/3b. The word line driver 5a/5b changes the selected word line to the read-out voltage Vcg to see whether the selected floating gate type field effect transistor is in the write-in state or the erased state. The word line drivers 5a/5b change the selected word line to the write-in voltage Vp so as to inject electron into the floating gate electrode.

The prior art electrically erasable and programmable read only memory device further comprises column address decoders/column selectors 7a/7b, sense amplifiers 8a/8b and a reference voltage generator 9. The column address decoders are connected to the address buffer 2a, and column address bits are supplied to the column address decoders. The column selectors are connected to the bit lines BLA1 to BLAn and BLB1 to BLBn, respectively, and the column address decoders cause the column selectors to selectively connect the bit lines BLA1 to BLAn and BLB1 to BLBn to the sense amplifiers 8a/8b. The sense amplifier 8a/8b is a differential amplifier. Though not shown in FIG. 1, a pre-charging circuit PCH (see FIG. 3) is connected to conductive lines between the sense amplifiers 8a/8b and the column selectors 7a/7b, and a discharging circuit DCH is connected between the conductive lines and a ground line GND and other conductive lines between the sense amplifiers 8a/8b and the reference voltage generator 9 (see FIG. 3).

The precharging circuit PCH has a series combination of a load transistor Q1 and a switching transistor Q2 connected between a power supply line Vdd and each conductive line, and a precharge control signal PREC is supplied to the gate electrodes of the switching transistors Q2. With the precharge control signal PREC, the switching transistor Q2 turns on, and current flows into the conductive line. The current passes through the column selector 7a/7b and the selected bit line BLA1–BLAn/BLB1–BLBn. One of the word lines WL1 to WLm is changed to the read-out voltage level Vcg, and the potential level Vb on the selected bit line is either maintained or decayed depending upon the threshold of the selected floating gate type field effect transistor MC. The potential level Vb on the selected bit line is propagated through the column selector 7a/7b, and changes potential level Vs on the conductive line.

The reference voltage generator 9 supplies a reference voltage Vref to the sense amplifiers 8a/8b, and the sense amplifier 8a/8b compares the potential level Vs with the reference voltage Vref to see whether the selected floating gate type field effect transistor is in the write-in state or the erased state. The sense amplifier 8a/8b quickly determines the current state of the selected floating gate type field effect transistor MC, and informs the input/output data buffer 10a of the current state of the floating gate type field effect transistor MC. Finally, the control circuit 11 changes a discharge control signal DIS to the active level, and the conductive lines are discharged through discharging transistors Q3 to the ground line GND.

Turning back to FIG. 1, the prior art electrically erasable and programmable read only memory device further comprises an input/output data buffer 10a connected to the sense amplifiers 8a/8b and the voltage generator 6. The read-out data bit is transferred from the sense amplifier 8a/8b to the input/output data buffer 10a, and the input/output data buffer 10a delivers an output data signal Dout corresponding to the read-out data bit. On the other hand, when an input data signal Din arrives at the input/output data buffer 10a, the input/output data buffer 10a informs the voltage generator 6 of the logic level of the input data signal Din, and the voltage generator 6 determines whether the write-in voltage Vp is to be applied or not.

The prior art electrically erasable and programmable read only memory device further comprises a control circuit 11, and the control circuit 11 controls the other circuits so as to selectively carry out, a data erasing, a data write-in and a data read-out.

The reference voltage generator 9 is hereinbelow detailed with reference to FIG. 3. The reference voltage generator 9 includes a dummy precharging circuit 9a connected between the power supply line Vdd and the conductive line, a reference memory cell RC of the floating gate type field effect transistor, a dummy column selector 9b connected between the conductive line and the reference memory cell RC and a control voltage generator 9c generating a reference control voltage Vrefg. The reference control voltage Vrefg is supplied to the control gate electrode CG of the reference memory cell RC.

The dummy precharging circuit 9a includes a dummy load transistor Q4 and a dummy switching transistor Q5 connected in series, and the dummy load transistor Q4 and the dummy switching transistor Q5 are equivalent to the load transistor Q1 and the switching transistor Q2, respectively. For this reason, the dummy precharging circuit 9a provides impedance equal to that of the precharging circuit PCH. Similarly, the dummy column selector provides an impedance equal to that of the column selector 7a/7b. Thus, the dummy precharging circuit 9a and the dummy column selector 9b are designed to be equivalent to the precharging circuit PCH and the column selector 7a/7b.

The reference memory cell RC has the same structure as the memory cells MC shown in FIG. 2, and is equal in dimensions to the memory cells MC. As described hereinbefore, the sense amplifier 8a/8b carries out a differential amplification, and it is necessary to regulate the reference voltage Vref to a mid point between the potential level Vs created in the write-in state and the potential level Vs created in the erased state. One of the approaches is to regulate the transistor characteristics IRC3/IRC3' of the reference memory cell RC between the transistor characteristics IMC"1" of the memory cell MC in the write-in state and the transistor characteristics IMC"0" of the memory cell MC in the erased state as shown in FIG. 4. The channel doping may make the transistor characteristics different between the memory cell MC and the reference cell RC. When the reference control voltage Vrefg is made equal to the control voltage Vcg, current IDr flowing into the reference cell RC is less than current IDm flowing into the selected memory cell MC in the erased state and more than the current flowing into the memory cell MC in the write-in state. The current IDm is converted to the voltage Vs, and the current IDr is converted to the reference voltage Vref. The reference voltage Vref falls within the two voltage levels Vs, and the sense amplifier 8a/8b quickly determines the current state of the selected memory cell MC. The different transistor characteristics IRC3/IRC3' and IMC"1"/IMC"0" is achieved through a channel doping. However, the different channel doping steps make the fabrication process complicated. It is desirable for the memory cells MC and the reference cell RC to have the same transistor characteristics. For this reason, the prior art electrically erasable and programmable read only memory device supplies a reference control voltage Vrefg different from the control voltage Vcg to the control gate electrode of the reference cell RC.

If the reference control voltage Vrefg is produced by a control voltage generator 9c' shown in FIG. 5, an enable signal VUP of the active low level causes the p-channel enhancement type switching transistor Q10 to turn on so as to supply current from the power voltage line Vdd through resistors R1/R2 to the ground line, and the reference control voltage Vrefg is taken out from a node between the resistors R1 and R2. The control voltage generator 9c' encounters a problem in that fluctuation on the power voltage line Vdd affects the reference control voltage Vrefg, only, and varies the margin between the reference control voltage Vrefg and the control voltage Vcg. If the margin becomes less than the least detectable potential difference of the sense amplifier 8a/8b, the sense amplifier 8a/8b falls into an error. For this reason, the control voltage generator 9c is arranged as shown in FIG. 6.

The control voltage generator 9c includes a p-channel enhancement type field effect transistor Q11 and two resistors R3/R4 connected in series between the control voltage line Vcg and the ground line GND. The enable signal VUP is supplied to the gate electrode of the p-channel enhancement type field effect transistor Q11. The reference control voltage Vrefg is taken out from the node between the resistors R3 and R4. The reference voltage generator 9c generates the reference voltage Vrefg lower than the control voltage Vcg, and the reference voltage generator 9 regulates the reference voltage Vref to a certain level between the voltage level Vs(off) created by the memory cell MC in the write-in state and the voltage level Vs(on) created by the memory cell MC in the erased state as shown in FIG. 7. If the reference control voltage Vrefg is adjusted to 1.50 volts, the reference voltage Vref is regulated to the mid point between the voltage levels Vs(on) and Vs(off). When the registers R3 and R4 are regulated to the ratio R3/R4 of 7:3, the control voltage generator 9c adjusts the reference control voltage Vrefg to 1.50 volts.

As described hereinbefore, the reference cell RC has the same structure as the memory cells MC, and the injection of electron is required for the reference cell RC. In other words, the evacuation of electron and the injection of electron are required for the reference cell RC concurrently with the memory cells MC. This means that the control circuit 11 controls not only the memory cells MC but also the reference cell RC for the data erasing and the data write-in. The data erasing operation and the data write-in operation on the reference cell RC make the circuit arrangement and the control sequence complicated. This is the first problem inherent in the prior art electrically erasable and programmable read only memory device.

Another problem is read-out disturbing phenomenon. It is seldom to successively access one of the memory cells MC. However, the reference control voltage Vrefg is applied to the control gate electrode of the reference cell RC at every access. When the current IDr flows through the reference cell RC, a small amount of electron is injected into the floating gate electrode FD, and the electron is gradually increased. As a result, the voltage-to-current characteristics are moved as indicated by IRC3 to IRC3' (see FIG. 4). Even if the reference voltage Vref is initially adjusted to the mid point Vref(0) between the voltage level Vs(on) and the voltage level Vs(off) (see FIG. 7), the accumulated electron decreases the channel conductance of the reference cell RC, and the reference voltage Vref is lifted from the mid point Vref(0) to a certain level Vref(1). This results in decrease of the potential difference between the voltage level Vs(off) and the reference voltage Vref(1).

SUMMARY OF THE INVENTION

It is therefore an important object of the present invention to provide a semiconductor non-volatile memory device, which is simple in arrangement and free from the read-out disturbing phenomenon.

To accomplish the object, the present invention proposes to directly control the channel conductance of a reference cell by applying a reference control voltage to a floating gate electrode thereof.

In accordance with one aspect of the present invention, there is provided a semiconductor non-volatile memory device comprising a plurality of addressable memory cells each implemented by a floating gate type field effect transistor for storing a data bit, a sense amplifier having a first input node and a second input node and carrying out a differential amplification for a potential difference between the first input node and the second input node, a selector leading first current through the first input node to one of the plurality of addressable memory cells so as to produce a potential level indicative of either logic level at the first input node and a reference voltage generator leading second current through the second input node and a reference cell to a constant potential source so as to produce a reference voltage between the potential level indicative of one logic level and the potential level indicative of the other logic level at the second input node, and the reference cell has the structure of the floating gate type field effect transistor with an interconnection electrically connecting a control gate electrode to a floating gate electrode.

BRIEF DESCRIPTION OF THE DRAWINGS

The features and advantages of the semiconductor non-volatile memory device will be more clearly understood from the following description taken in conjunction with the accompanying drawings in which.

DESCRIPTION OF THE PREFERRED EMBODIMENTS

First Embodiment

Figure 8:
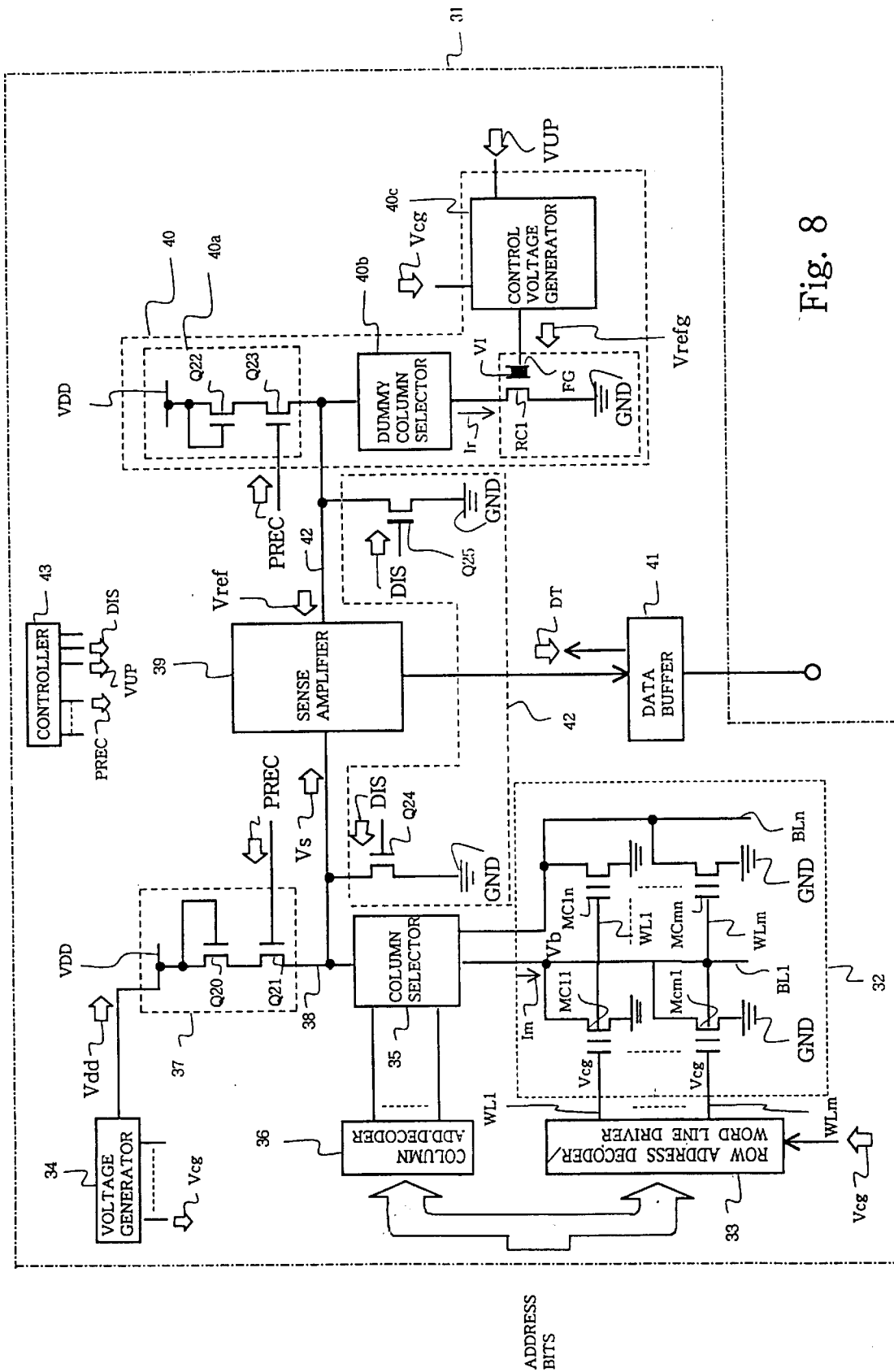
FIG. 8 is a circuit diagram showing an essential feature of an electrically erasable and programmable read only memory device according to the present invention.

Referring to FIG. 8 of the drawings, an electrically erasable and programmable read only memory device embodying the present invention is fabricated on a single semiconductor chip 31, and has an erasing mode, a write-in mode and a read-out mode, These modes of operation are well known to a person skilled in the art, and description is focused on the read-out mode of operation and related components for the sake of simplicity.

The electrically erasable and programmable read only memory device comprises a memory cell array 32 and a row address decoder/word line driver 33. Plural memory cells MCi11, . . . MC1n, . . . MCm1, . . . . And MCmn form the memory cell array 32, and each of the memory cells MC11 to MCmn is implemented by the floating gate type field effect transistor. Word lines WL1 to WLm are selectively connected to the control gate electrodes of the memory cells MC11 to MCmn, and bit lines BL1 to BLn are selectively connected to the drain nodes of the memory cells MC11 to MCmn. Row addresses are respectively assigned the word lines WL1 to WLm, and column addresses are respectively assigned the bit lines BL1 to BLn. For this reason, each of the memory cells MC11 to MCmn is specified by using the row address and the column address. The row address decoder/word line driver 33 is connected to the word lines WL1 to WLm, and is responsive to row address bits indicative of the row address so as to selectively energize the word lines WL1 to WLm. A voltage generator 34 supplies a read-out voltage Vcg to the row address decoder/word line driver 33 in the read-out mode of operation, and the row address decoder/word line driver 33 lists the selected word line WL1–WLm to the read-out voltage Vcg.

The electrically erasable and programmable read only memory device further comprises a column selector 35, a column address decoder 36 and a precharging circuit 37. The column selector 35 is connected between the bit lines BL1 to BLn and a conductive line 38, and the precharging circuit 37 is connected between a positive power supply line VDD and the conductive line 38. A series combination of an n-channel enhancement type load transistor Q20 and an n-channel enhancement type switching transistor Q21 forms the precharging circuit 37, and the n-channel enhancement type switching transistor Q21 is responsive to a precharge control signal PREC so as to electrically connect the conductive line 38 through the n-channel enhancement type load transistor Q20 to the positive power supply line VDD. The column address decoder 36 is responsive to column address bits indicative of the column address so that the column selector 35 electrically connects the conductive line 38 to one ofthe bit lines BL1 to BLn assigned the column address specified by the column address bits. Then, the precharging circuit 37 supplies current Im through the column selector 35 to the selected bit line.

If electron has been already evacuated from the floating gate electrode of the selected memory cell, the selected memory cell has a low threshold, and the read-out voltage Vcg on the associated word line allows the current Im to flow through the selected memory cell into the ground line GND. For this reason, the potential level Vs on the conductive line 38 goes down to Vs(0). On the other hand, if electron has been injected into the floating gate electrode of the selected memory cell, the selected memory cell has a high threshold, and the read-out voltage can not generate a conductive channel in the selected memory cell. For this reason, the conductive line 38 maintains the potential level Vs at Vs(1).

In this instance, the row address decoder/word line driver 33, the column address decoder 36 and the column selector 35 as a whole constitute a selector.

The electrically erasable and programmable read only memory device further comprises a sense amplifier 39, a reference voltage generator 40 and a data buffer 41. The sense amplifier 39 carries out a differential amplification, and has two input nodes. One of the input nodes is connected to the conductive line 38, and the other input node is connected through a conductive line 42 to the reference voltage generator 40. The reference voltage generator 40 generates a reference voltage Vref, and the reference voltage Vref is adjusted to the mid level between Vs(0) and Vs(1).

In detail, the reference voltage generator 40 includes a dummy precharging circuit 40a connected to the positive power supply line VDD, a dummy column selector 40b connected through the conductive line 42 to the dummy precharging circuit 40a, a reference cell RC1 connected between the conductive line 42 and the ground line GND and a control voltage generator 40c connected to the control gate electrode of the reference cell RC1. The precharging circuit 40a is implemented by a series of an n-channel enhancement type dummy load transistor Q22 and an n-channel enhancement type dummy switching transistor Q23, and the n-channel enhancement type dummy load transistor Q22 and the n-channel enhancement type dummy switching transistor Q23 are equivalent to the n-channel enhancement type load transistor Q20 and the n-channel enhancement type switching transistor Q21, respectively. For this reason, the total resistance of the n-channel enhancement type dummy load transistor Q22 and the n-channel enhancement type dummy switching transistor Q23 is equal to that of the n-channel enhancement type load transistor Q20 and the n-channel enhancement type switching transistor Q21. The dummy column selector 40b is equivalent to the column selector 35, and provides a resistance equal to that of the column selector 35. The control voltage generator 40c is responsive to an enable signal VUP so as to flow current from a read-out voltage line through a switching transistor and resistors to the ground line, and produces a reference control voltage Vrefg from the control voltage Vcg. The arrangement of the switching transistor and the resistors is similar to that shown in FIG. 6.

Figure 10:
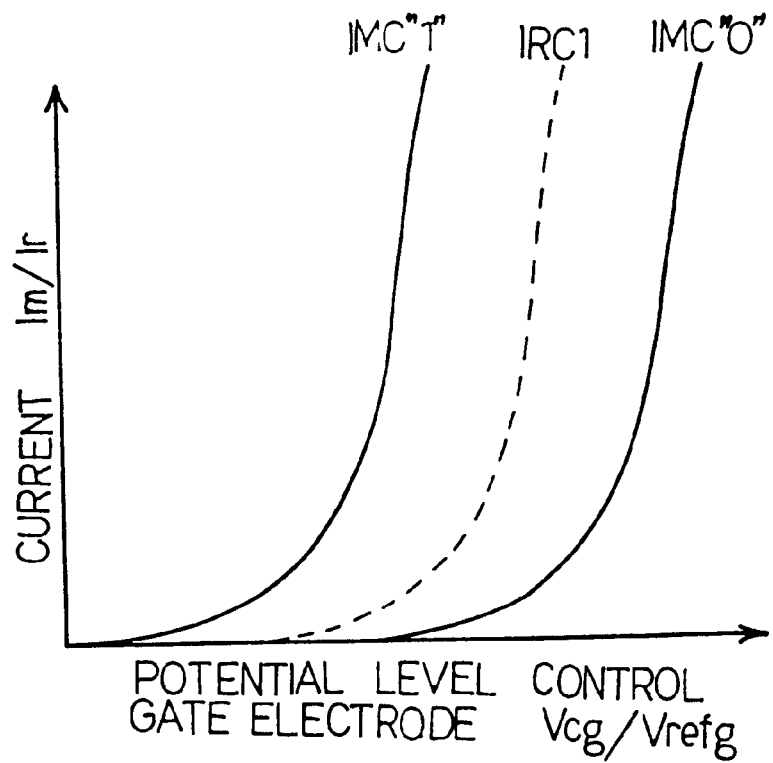
FIG. 10 is a graph showing the voltage-to-current characteristics of both reference and memory cells.

The reference cell RC1 is implemented by the floating gate type field effect transistor as similar to the memory cells MC11 to MCmn. However, the control gate electrode CG is connected through a vertical interconnection VI to the floating gate electrode FG, and a capacitor C22 takes place between the floating gate electrode FG and the semiconductor substrate 31. The reference cell RC1 has voltage-to-current characteristics indicated by plots IRC1, and the voltage-to-current characteristics IRC1 falls into the range between the voltage-to-current characteristics IMC"1" and the voltage-to-current characteristics IMC"0" as shown in FIG. 10. The reference control voltage Vrefg causes the reference cell RC1 to adjust the reference voltage Vref to the mid level between Vs(1) and Vs(0). The reference cell RC1 and the memory cells MC11 to MCmn are fabricated together, and only the contact hole CH is formed before deposition of conductive material for the control gate electrodes CG. For this reason, the vertical interconnection VI does not make the fabrication process complicated.

Turning back to FIG. 8, the sense amplifier 39 compares the potential level Vs with the reference voltage Vref to see whether or not the selected memory cell is in the write-in state or the erased state. The sense amplifier 39 supplies a read-out data signal representative of either write-in or erased state to the data buffer 41, and the data buffer 41 produces an output data signal from the read-out data signal.

The electrically erasable and programmable read only memory device further comprises a discharging circuit 42 and a controller 43. The discharging circuit 42 has n-channel enhancement type switching transistors Q24 and Q25 connected between the conductive lines 38/42 and the ground line GND. The n-channel enhancement type switching transistors Q24/Q25 are responsive to a discharge control signal DIS so as to discharge the potential Vs/Vref from the conductive lines 38/42 to the ground line GND. The controller 43 produces internal control signals such as the precharge control signal PREC, the enable signal VUP and the discharge control signal DIS at appropriate timings, and supplies them to the other circuits.

Figure 11:
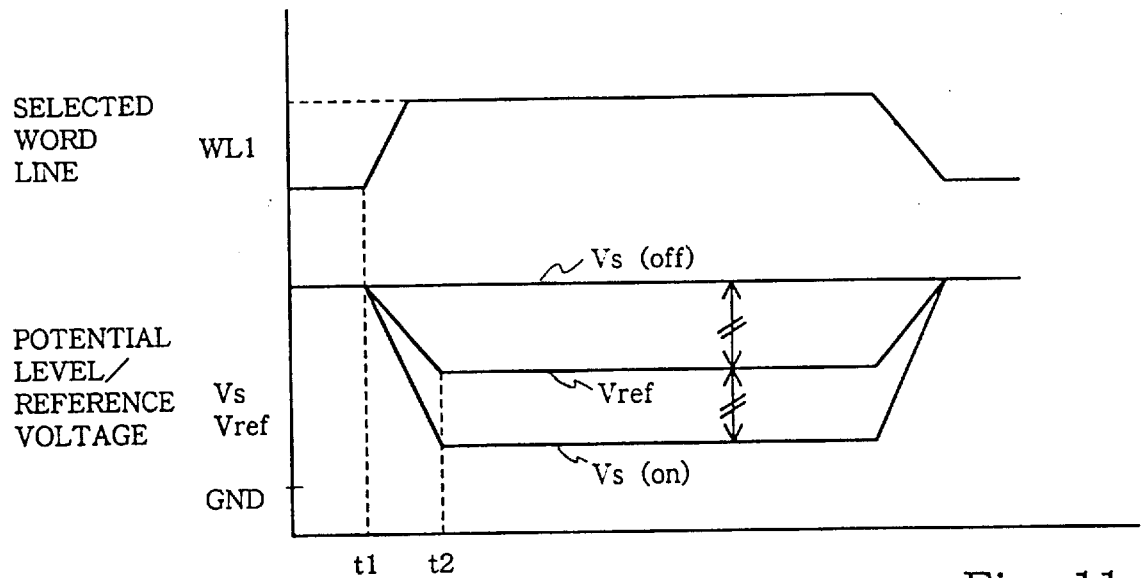
FIG. 11 is a graph showing the potential level on a selected word line and the potential levels on conductive lines connected to a sense amplifier.

The electrically erasable and programmable read only memory device behaves in the read-out mode of operation as follows. Assuming now that the memory cell MC11 is accessed, the row address bits and the column address bits are respectively supplied to the row address decoder/word line driver 33 and the column address decoder 36. The controller 43 changes the discharge control signal DIS to the inactive level and the precharge control signal PREC and the enable signal VUP to the active level. The row address decoder/word line driver 33 supplies the read-out voltage Vcg to the word line WL1, and the word line WL1 starts to rise at time t1 (see FIG. 11). On the other hand, the column address decoder 36 causes the column selector 35 to connect the bit line BL1 to the conductive line 38. As a result, the current Im flows into the bit line BL1, and the current Ir flows into the reference cell RC1. The potential level Vs on the conductive line 38 is either maintained (see Vs(off)) or delayed (see Vs(on)) depending upon the current state of the selected memory cell MC11. The potential level Vs and the reference voltage Vref become stable at time t2, and the reference voltage Vref is at the mid point between Vs(off) and Vs(on). The sense amplifier 39 judges the current state of the selected memory cell MC11, and supplies the read-out data signal DT to the data buffer 41. Even though the current Ir flows at every data access, any electron is never accumulated in the floating gate electrode FG, and the reference cell RC1 maintains the voltage-to-current characteristics IRC1. This means that the reference voltage Vref stays at the mid point between the voltage level Vs(on) and the voltage level Vs(off), and the sense amplifier does not mistakenly judge the current state of the selected memory cell MC.

As will be appreciated from the foregoing description, the vertical interconnection VI electrically connects the control gate electrode CG to the floating gate electrode FG, and the reference control voltage Vrefg affects the electric properties of the channel only through the capacitor C22. This feature results in the following advantages. First, it is not necessary for the reference cell RC1 to carry out the write-in and the erasing, and the electrically erasable and programmable read only memory device according to the present invention is simple in arrangement. Second, the reference cell is free from the read-out disturbing phenomenon, because the electron is never accumulated in the floating gate electrode FG.

Second Embodiment

Figure 12:
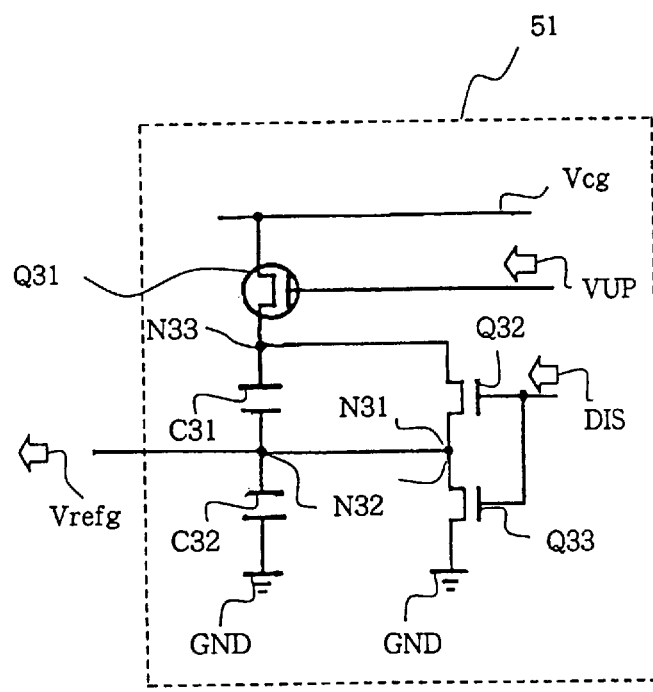
FIG. 12 is a circuit diagram showing the circuit configuration of a control voltage generator incorporated in another electrically erasable and programmable read only memory device according to the present invention.

FIG. 12 illustrates another reference control voltage generator 51 incorporated in another electrically erasable and programmable read only memory device embodying the present invention. The other circuits are similar to those of the electrically erasable and programmable read only memory device shown in FIG. 8, and description is focused on the reference control voltage generator 51.

Figure 1:
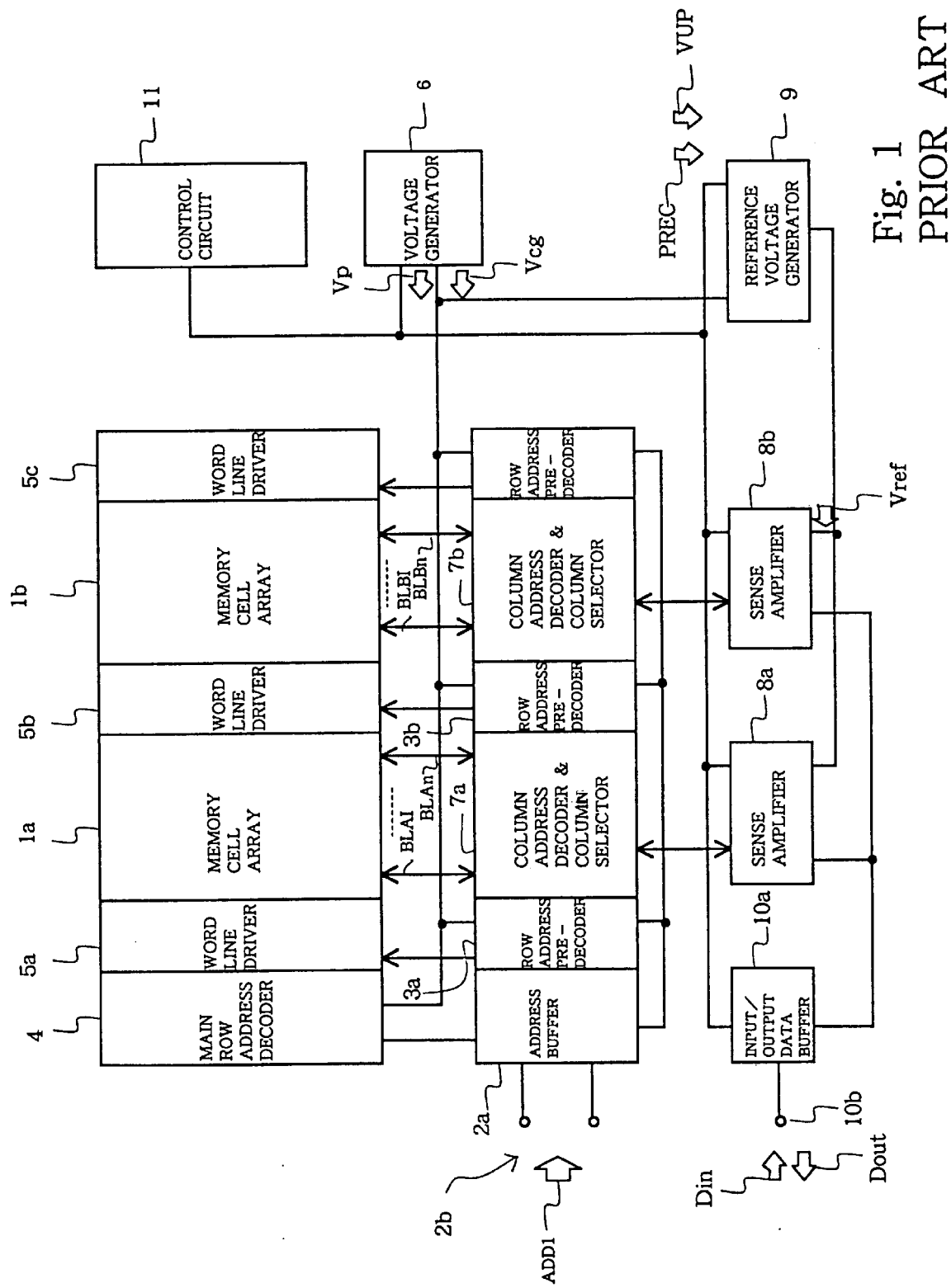
FIG. 1 is a block diagram showing the arrangement of the prior art electrically erasable and programmable read only memory device.
Figure 2:
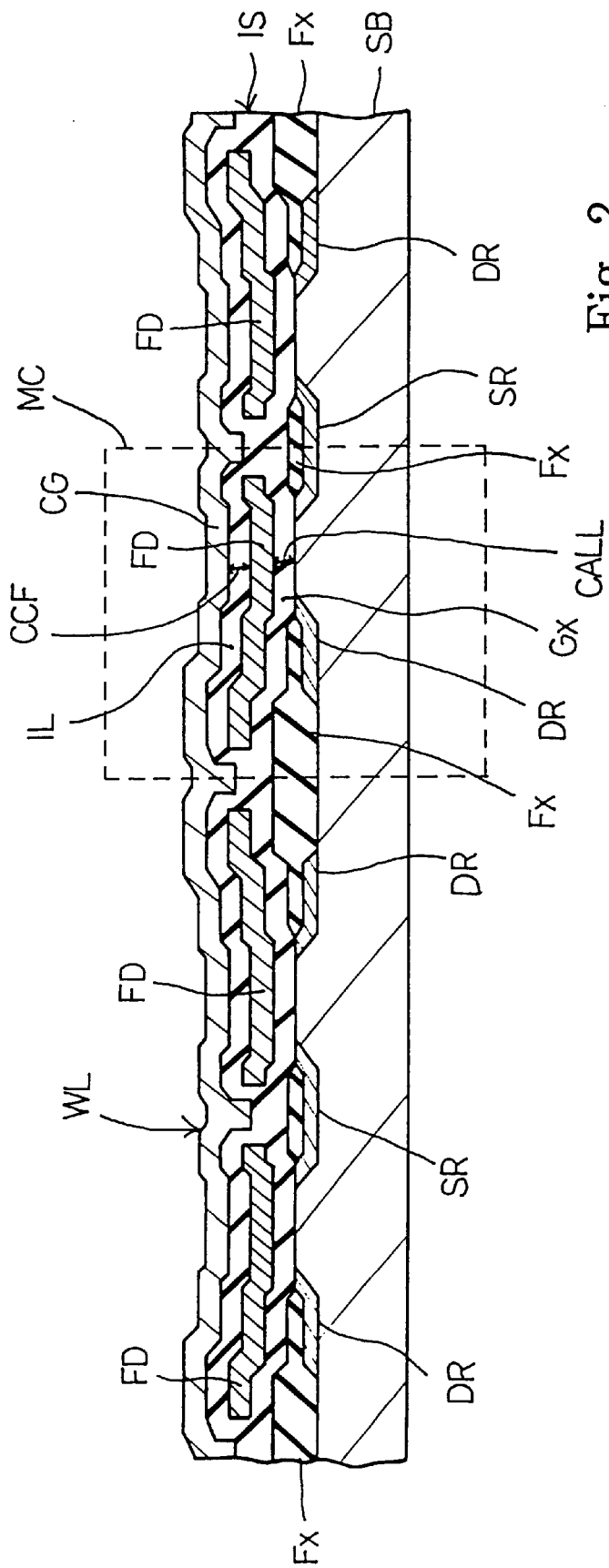
FIG. 2 is a cross sectional view showing the structure of the floating gate type field effect transistor.
Figure 3:
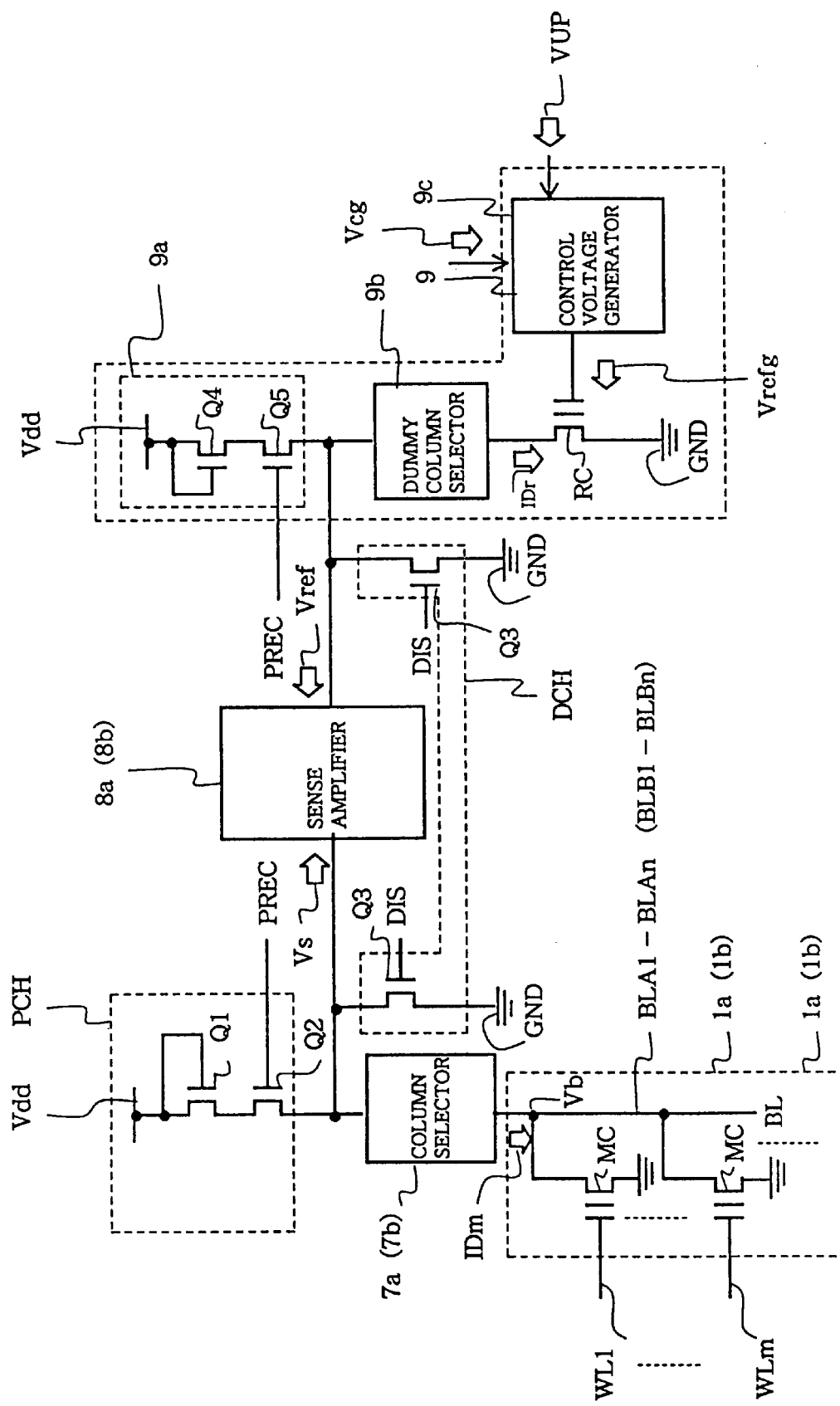
FIG. 3 is a block diagram showing the circuit configuration of the reference voltage generator incorporated in the prior art electrically erasable and programmable read only memory device.
Figure 4:
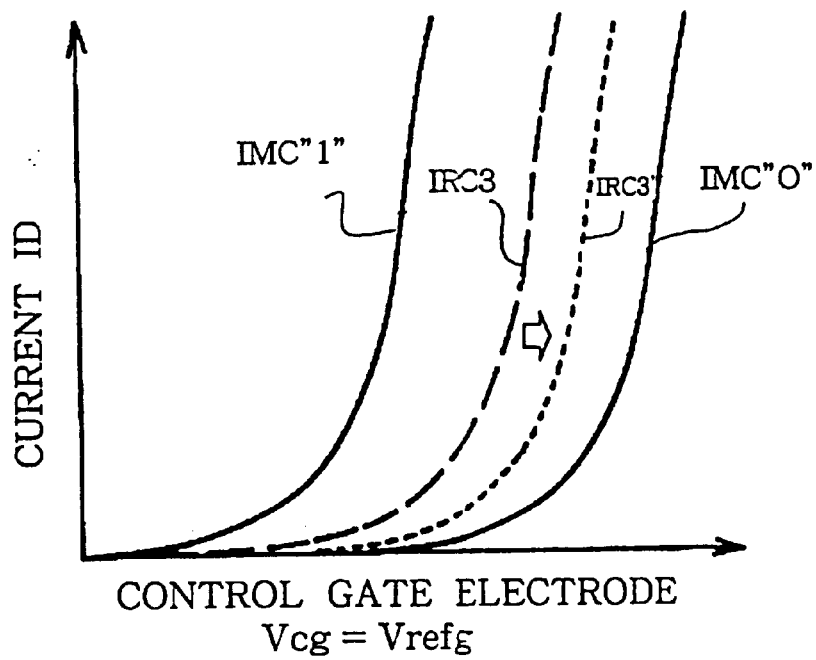
FIG. 4 is a graph showing the transistor characteristics of the memory cell and the reference cell.
Figure 5:
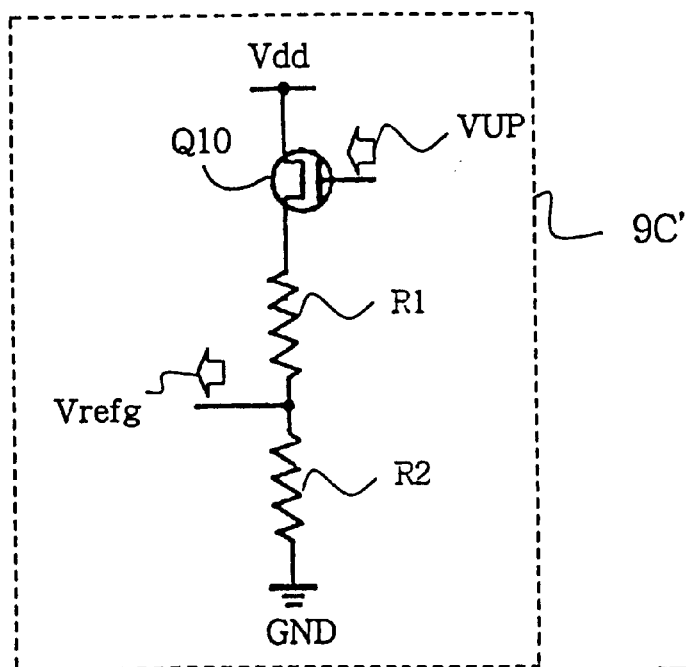
FIG. 5 is a circuit diagram showing the prior art control voltage generator available for the prior art electrically erasable and programmable read only memory device.
Figure 6:
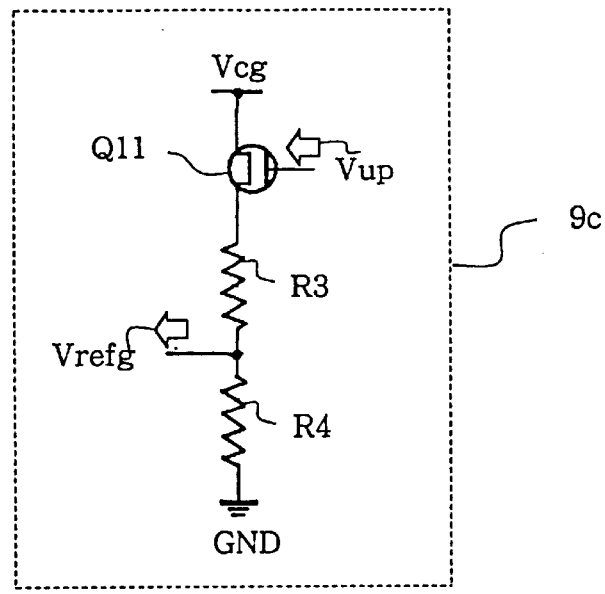
FIG. 6 is a circuit diagram showing the prior art control voltage generator incorporated in the prior art electrically erasable and programmable read only memory device.
Figure 7:
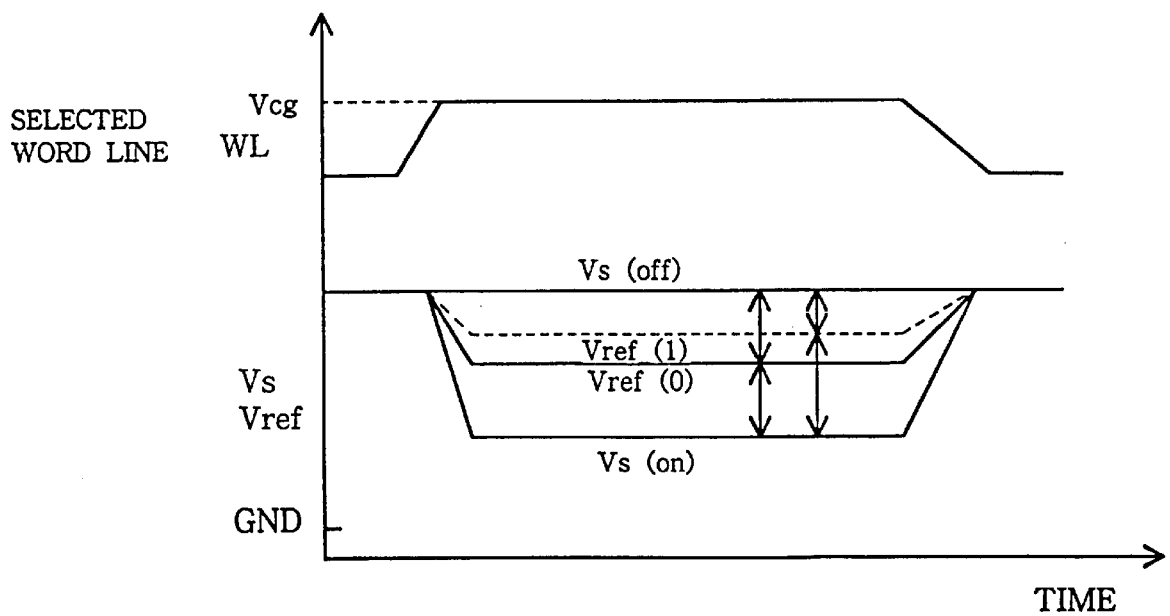
FIG. 7 is a graph showing the control voltage and the reference control voltage used in the prior art electrically erasable and programmable read only memory device.

As described hereinbefore, the control voltage generator 40c has the same arrangement as the voltage generator 9c shown in FIG. 6. The control voltage generator 40c continuously flows current through the switching transistor and the resistors, and the voltage generator 34 requires a large current driving capability. This means that the voltage generator 34 occupies wide area on the semiconductor chip 31. Moreover, when the control voltage Vcg fluctuates, the control voltage Vcg affects the channel conductivity of the selected memory cell through the capacitor between the control gate electrode and the floating gate electrode. On the other hand, the fluctuation of control voltage is directly applied to the floating gate electrode FG of the reference memory cell, and strongly affects the channel conductivity of the reference cell RC1. If the fluctuation is wide, the potential difference between the reference voltage Vref and the potential level Vs undesirably becomes smaller than the minimum detectable potential difference of the sense amplifier 39.

In order to reduce the influence of the fluctuation, the control voltage generator 40c includes a p-channel enhancement type switching transistor Q31, a series of capacitors C31/C32 connected between the p-channel enhancement type switching transistor Q31 and the ground line GND and a series of n-channel enhancement type switching transistors Q32/Q33 connected between the p-channel enhancement type switching transistor Q31 and the ground line GND. The intermediate node N31 between the n-channel enhancement type switching transistors Q32 and Q33 is connected to the intermediate node N32 between the capacitors C31 and C32, and the discharge control signal DIS is supplied to the gate electrodes of the n-channel enhancement type switching transistors Q32 and Q33. While the electrically erasable and programmable read only memory device is operating in the read-out mode of operation, the discharge control signal DIS is in the inactive level, and the control voltage Vcg is supplied through the p-channel enhancement type switching transistor Q31. Then, the reference control voltage Vrefg takes place at the intermediate node N32. Assuming now that the control gate voltage Vcg is 5.0 volts, the series of capacitors C31/C32 regulates the reference control voltage Vrefg to 1.5 volts under the condition that C31:C32=3:7.

Figure 9:
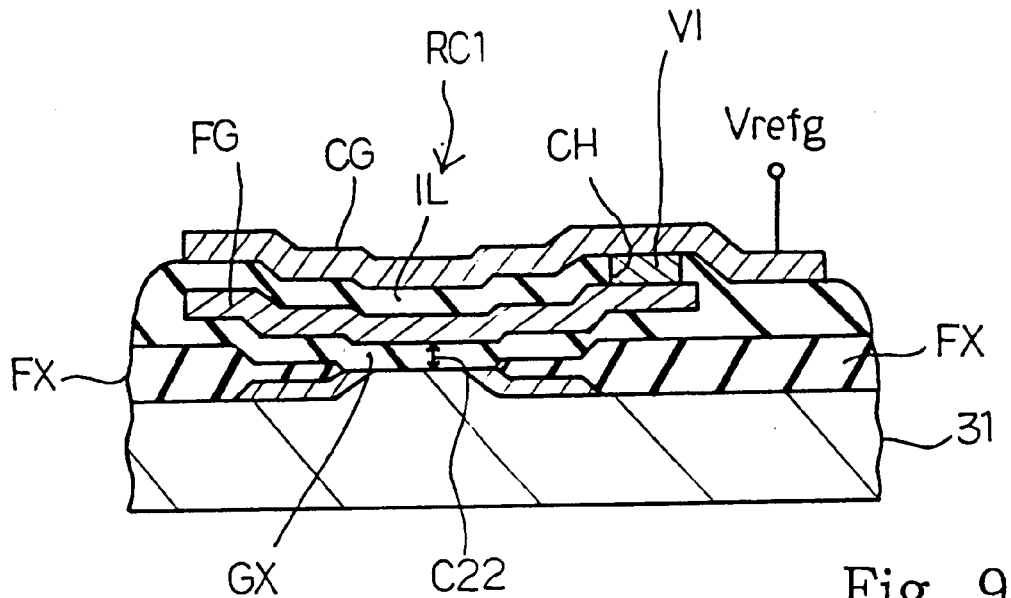
FIG. 9 is a cross sectional view showing the structure of a reference cell incorporated in the electrically erasable and programmable read only memory device.
Figure 13:
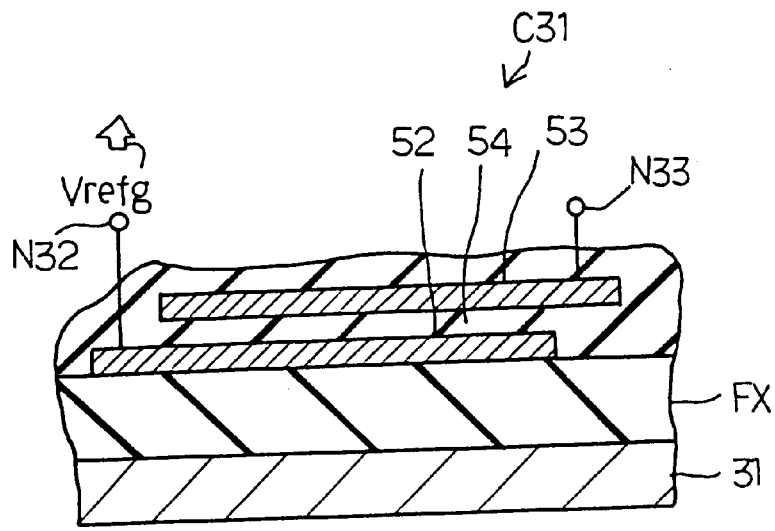
FIG. 13 is a cross sectional view showing the structure of a series of capacitors incorporated in a reference control voltage generator.

The series of capacitors C31/C32 is realized as follows. The capacitor C22 (see FIG. 9) is used as the capacitor C32. The semiconductor substrate 31, the floating gate electrode FG and a gate oxide GX form the capacitor C22. On the other hand, the capacitor C31 is formed on the field oxide layer FX as shown in FIG. 13, and a lower electrode 52, an upper electrode 53 and an insulating layer 54 therebetween form in combination the capacitor C31. The lower electrode 52 and the upper electrode 53 are formed concurrently with the floating gate electrode FG and the control gate electrode CG, respectively, and insulating material is deposited over the floating gate electrode FG and the lower electrode 52 so as to form the insulating layers 54 and IL. The upper electrode 53 is connected through the node N33 to the p-channel enhancement type field effect transistor Q31.

Figure 14:
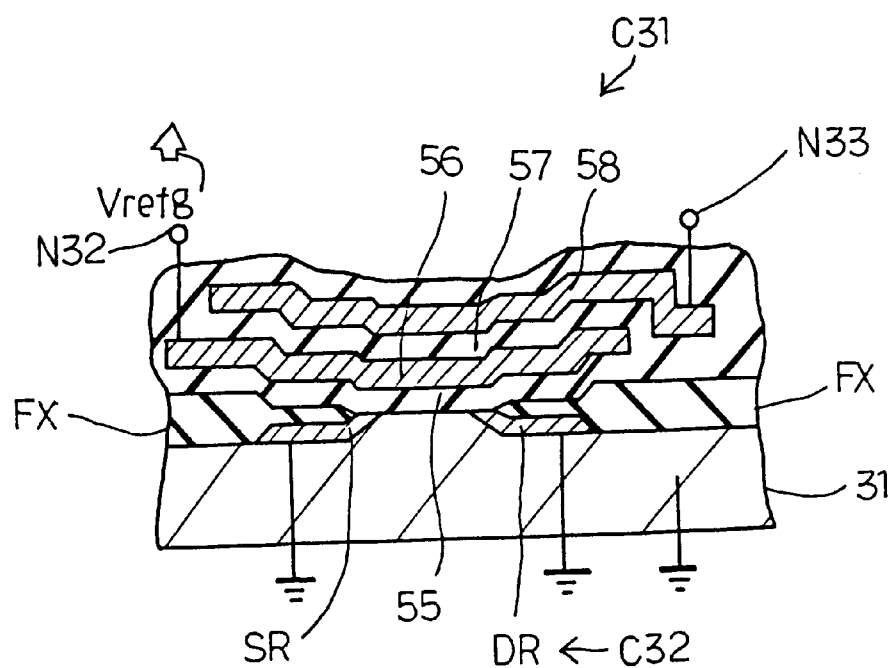
FIG. 14 is a cross sectional view showing the structure of another series of capacitors.

Alternatively, the series of capacitors C31/C32 is formed on an active area as shown in FIG. 14. The series of capacitor C31/C32 has the structure similar to the memory cell MC11–MCmn, and is fabricated concurrently therewith. An insulating layer 55, a lower conductive layer 56, an insulating layer 57 and an upper conductive layer 58 are formed concurrently with the gate oxide layer GX, the floating gate electrode FG, the insulating layer IL and the control gate electrode CG, respectively. A source region SR and a drain region DR are formed in the semiconductor chip 31. The semiconductor chip 31, the insulating layer 55 and the lower conductive layer 56 form the capacitor C32, and the lower conductive layer 56, the insulating layer 57 and the upper conductive layer 58 form the capacitor C31. Thus, the series of capacitors C31/C32 does not complicate the fabrication process.

Figure 15:
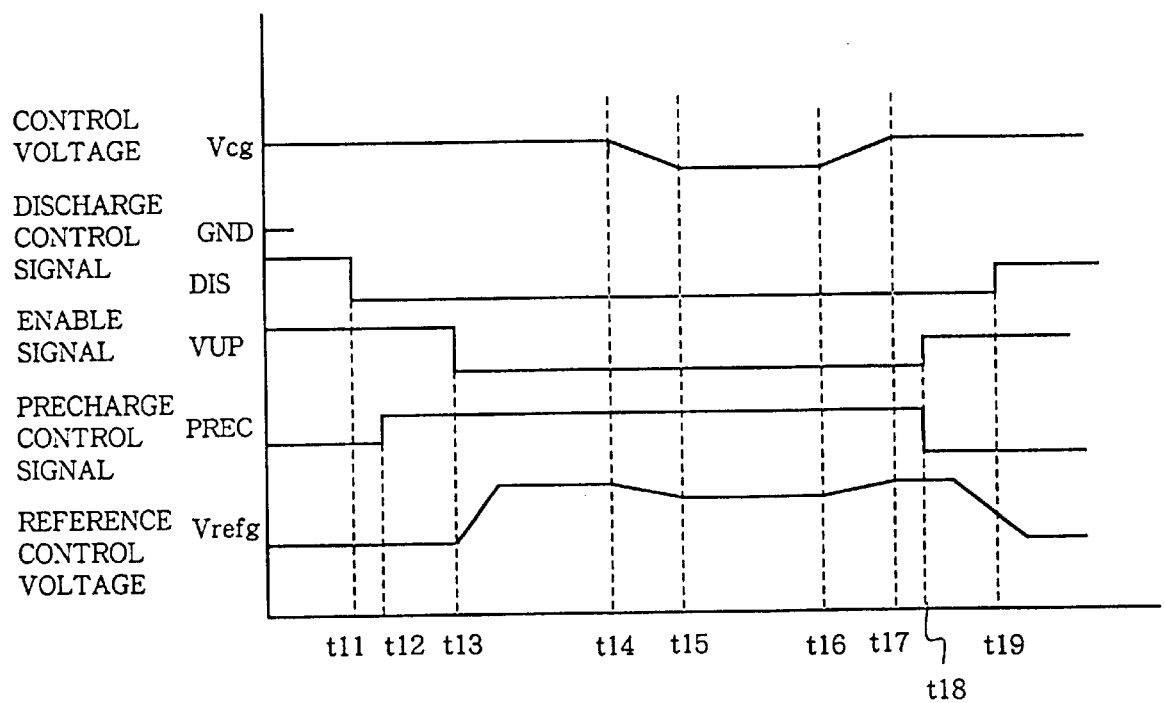
FIG. 15 is a diagram showing the behavior of the reference voltage generator.

The reference voltage generator 51 behaves as shown in FIG. 15. First, the discharge control signal DIS is changed to the inactive level at time t11, and the capacitor C31 and the conductive lines 38/42 are isolated from the ground line GND.

The precharge control signal PREC is changed to the active level at time t12, and the precharging circuit 37 and the dummy precharge circuit 40a supply the current to the conductive lines 38/42, respectively. The enable signal VUP is changed to the active level at time t13, and current is supplied to the capacitor C31. Then, the reference control signal Vrefg starts to rise.

The potential level Vs and the reference voltage Vref are supplied to the sense amplifier 39, and the sense amplifier 39 carries out the differential amplification. Although the control voltage Vcg is delayed between time t14 and time t15 and is recovered in the time period between time t16 ad time t17, the reference control voltage Vrefg is proportionally decayed and recovered, and the temporary decay and the recovery do not affect the differential amplification.

The precharge control signal PREC and the enable signal VUP are recovered to the inactive levels at time t18, and the discharge control signal DIS is changed to the active level at time t19.

The electrically erasable and programmable read only memory device implementing the second embodiment achieves all the advantages of the first embodiment, and enhances the stability of the differential amplification by virtue of the capacitors C31/C32.

Although particular embodiments of the present invention have been shown and described, it will be obvious to those skilled in the art that various changes and modifications may be made without departing from the spirit and scope of the present invention.

The electrically erasable and programmable read only memory device may be integrated on a semiconductor chip together with other macro-blocks.

The memory cells MC11 to MCmn may form a memory block, which in part forms one of the memory cell blocks of a flash write memory.

The memory cells may be not electrically erasable, but is, by way of example, erased through radiation of ultra violet light.

What is claimed is:

1. A semiconductor non-volatile memory device comprising
   a plurality of addressable memory cells each implemented by a floating gate type field effect transistor for storing a data bit,
   a sense amplifier having a first input node and a second input node and carrying out a differential amplification for a potential difference between said first input node and said second input node,
   a selector leading first current through said first input node to one of said plurality of addressable memory cells so as to produce a potential level indicative of either logic level of the data bit at said first input node, and
   a reference voltage generator leading second current through said second input node and a reference cell to a constant potential source so as to produce a reference voltage between said potential level indicative of one logic level and said potential level indicative of the other logic level at said second input node, said reference cell having the structure of said floating gate type field effect transistor with an interconnection electrically connecting a control gate electrode to a floating gate electrode.

2. The semiconductor non-volatile memory device as set forth in claim 1, in which said plurality of memory cells are electrically erasable and programmable.

3. The semiconductor non-volatile memory device as set forth in claim 1, in which said reference voltage generator further includes a reference control voltage generator for producing a reference control voltage from a control voltage, and said reference control voltage and said control voltage are supplied to said control gate electrode of said reference cell and a control gate electrode of said one of said plurality of memory cells.

4. The semiconductor non-volatile memory device as set forth in claim 3, in which said reference control voltage generator has a series combination of resistive elements connected between a source of said control voltage and a constant potential line so as to produce said reference control voltage at an intermediate node in said series of resistive elements.

5. The semiconductor non-volatile memory device as set forth in claim 3, in which said reference control voltage generator has a series combination of capacitors connected between a source of said control voltage and a constant potential line so as to produce said reference control voltage at an intermediate node of said series of capacitors.

6. The semiconductor non-volatile memory device as set forth in claim 5, in which one of the capacitors of said series combination is formed between said floating gate electrode of said reference cell and a semiconductor substrate, and another of said capacitors is formed on a field insulating layer selectively grown on said semiconductor substrate.

7. The semiconductor non-volatile memory device as set forth in claim 5, in which said series combination has the same structure as said floating gate type field effect transistor, one of the capacitors of said series combination is formed between a floating gate electrode of said same structure and a semiconductor substrate, and the other of said capacitors is formed between said floating gate electrode and a control gate electrode of said same structure.

8. The semiconductor non-volatile memory device as set forth in claim 5, in which said reference control voltage generator further includes a switching circuit connected between said series combination of capacitors and said constant potential line and responsive to a discharge control signal so as to discharge electric charges from said capacitors to said constant potential line after completion of data access to said plurality of memory cells.

9. The semiconductor non-volatile memory device as set forth in claim 1, further comprising a precharging circuit connected between a power supply line and said first input node for supplying said first current to said one of said plurality of memory cells, and said reference voltage generator further has a dummy precharging circuit connected between said power supply line and said second input node for supplying said second current to said reference cell.

10. The semiconductor non-volatile memory device as set forth in claim 9, in which said precharging circuit and said dummy precharging circuit provide a certain resistance against said first current and said second current, respectively.

11. The semiconductor non-volatile memory device as set forth in claim 9, in which said selector includes
    a row address decoder/word line driver connected through word lines to the control gate electrodes of said plurality of memory cells and responsive to row address bits so as to selectively changing said word lines to a control voltage to see whether said one of said plurality of memory cells passes said first current or blocks said first current,
    a column selector connected between said first input node and the drain nodes of said plurality of memory cells and
    a column address decoder connected to said column selector and responsive to column address bits so as to selectively connect said drain nodes to said first input node, and
    said reference voltage generator further includes a dummy column selector connected between said second input node and said reference cell.

12. The semiconductor non-volatile memory device as set forth in claim 11, in which the total resistance of said precharging circuit and said column selector is approximately equal to the total resistance of said dummy precharging circuit and said dummy column selector.

13. The semiconductor non-volatile memory device as set forth in claim 11, in which said reference voltage generator further includes a reference control voltage generator for producing said reference control voltage from said control voltage.

14. The semiconductor non-volatile memory device as set forth in claim 13, in which said reference control voltage generator has a series combination of resistive elements connected between a source of said control voltage and a constant potential line so as to produce said reference control voltage at an intermediate node in said series of resistive elements.

15. The semiconductor non-volatile memory device as set forth in claim 13, in which said reference control voltage generator has a series combination of capacitors connected between a source of said control voltage and a constant potential line so as to produce said reference control voltage at an intermediate node of said series of capacitors.

16. The semiconductor non-volatile memory device as set forth in claim 15, in which one of the capacitors of said series combination is formed between said floating gate electrode of said reference cell and a semiconductor substrate, and another of said capacitors is formed on a field insulating layer selectively grown on said semiconductor substrate.

17. The semiconductor non-volatile memory device as set forth in claim 15, in which said series combination has the same structure as said floating gate type field effect transistor, one of the capacitors of said series combination is formed between a floating gate electrode of said same structure and a semiconductor substrate, and the other of said capacitors is formed between said floating gate electrode and a control gate electrode of said same structure.

* * * * *